United States Patent [19]

Cote et al.

[11] Patent Number: 5,216,282
[45] Date of Patent: Jun. 1, 1993

[54] SELF-ALIGNED CONTACT STUDS FOR SEMICONDUCTOR STRUCTURES

[75] Inventors: Donna R. Cote, Poughquag; David Stanasolovich, Wappingers Falls, both of N.Y.; Ronald A. Warren, Essex Junction, Vt.

[73] Assignee: International Business Machines Corporation, Armonk, N.Y.

[21] Appl. No.: 784,193

[22] Filed: Oct. 29, 1991

[51] Int. Cl.⁵ ................. H01L 29/600; H01L 29/620
[52] U.S. Cl. .................................... 257/773; 257/412; 257/752; 257/763
[58] Field of Search .................. 357/65, 23.1, 23.3, 357/23.4; 257/412, 752, 763, 773

[56] References Cited

U.S. PATENT DOCUMENTS

| | | | |
|---|---|---|---|
| 4,476,482 | 10/1984 | Scott et al. | 357/23.1 |
| 4,878,105 | 10/1989 | Hirakawa et al. | 357/65 |
| 4,925,807 | 5/1990 | Yoshikawa | 357/23.3 |
| 4,980,752 | 12/1990 | Jones, Jr. | 357/65 |
| 5,043,786 | 8/1991 | Desilets et al. | 357/35 |

FOREIGN PATENT DOCUMENTS

| | | | |
|---|---|---|---|
| 0075454 | 3/1983 | European Pat. Off. | 357/65 |
| 0363297 | 4/1990 | European Pat. Off. | 357/65 |
| 0214067 | 8/1989 | Japan | 357/65 |

Primary Examiner—Rolf Hille
Assistant Examiner—Peter Toby Brown
Attorney, Agent, or Firm—Richard Lau

[57] ABSTRACT

A contact stud for a semiconductor structure is fabricated by providing a semiconductor substrate having an alignment structure, which includes a sidewall, and the semiconductor structure formed thereon, forming a sidewall spacer contiguous with the semiconductor structure and the sidewall of the alignment structure, depositing an insulating layer contiguous with the sidewall spacer so as to insulate the semiconductor structure, etching the sidewall spacer selectively to the sidewall of the alignment structure, the semiconductor structure and the insulating layer for forming a contact window opening for allowing access to the semiconductor structure, and backfilling the contact window opening with a conductive material so as to contact the semiconductor structure for forming the stud.

7 Claims, 6 Drawing Sheets

SELF-ALIGNED CONTACT STUDS FOR SEMICONDUCTOR STRUCTURES

TECHNICAL FIELD

The present invention relates generally to semiconductor devices and, more particularly, to the structure and fabrication of a stud for a semiconductor device or structure thereof, used for connecting the device or structure to another electronic device or component.

BACKGROUND OF THE INVENTION

Semiconductor fabrication technology continues in a trend towards increasing circuit density and further microminiaturization of semiconductor structures. A semiconductor structure in this context is defined as any region, device, component, or element thereof that can be grown, formed, diffused, implanted, deposited, etc. into or onto a semiconductor substrate. For example, the gate conductor in today's high speed semiconductor transistor devices has diminished to a width of $0.4 \times 10^{-6}$ meters, and it is foreseen that this width will be further decreased to $0.1 \times 10^{-6}$ meters.

A stud is an electrically conductive element which contacts a structure or element of a semiconductor device and allows the device to be connected with another semiconductor structure or electronic device. As the dimensions of a semiconductor structure decreases, the available area for forming a stud to adequately contact the structure also decreases. Thus, a high degree of accuracy is required to properly form and align a stud so as to contact a microminiaturized semiconductor structure. In other words, increased microminiaturization of semiconductor structures leads to the problem of decreased alignment error tolerance when fabricating contact studs for such structures.

Moreover, minimizing contact resistance between a contact stud and a semiconductor structure is important for increasing speed and optimizing circuit performance. In this regard, a contact stud is generally fabricated so as to contact the top surface of a semiconductor structure. Thus, the available area for the stud to contact the structure is dictated by and limited to the width of the top surface of the structure.

Although further increasing of circuit layout density does not generally require considerable decrease in the height of the structure, it does require significant diminishment in the overall width of the structure. In other words, the aspect ratio (width to height ratio) of the structure is decreased in order to increase circuit layout density. Accordingly, the available area of width on the top portion of the structure for the stud to contact the structure is also decreased. Unfortunately, the area of contact between the stud and the structure controls the amount of contact resistance therebetween, such that a decrease in the area of contact leads to an undesirable increase in contact resistance.

SUMMARY OF THE INVENTION

It is therefore an object of the present invention to further increase circuit density and allow for further microminiaturization of semiconductor devices.

It is another object of the present invention to provide a manufacturing process which can accurately and properly form and align a contact stud for a semiconductor structure.

It is yet a further object of the invention to minimize contact resistance by increasing the contact region between a contact stud and semiconductor structure.

It is another further object of the invention to increase the contact region between a contact stud and a semiconductor structure by contacting the stud along a sidewall of the structure.

It is still another object of the invention to provide a manufacturing process which self-aligns a contact stud along a sidewall of a structure on a semiconductor substrate.

In order to accomplish the above and other objects of the invention, a process for fabricating a stud for a semiconductor structure includes the steps of providing a semiconductor substrate having an alignment structure, which includes a sidewall, and the semiconductor structure formed thereon, forming a sidewall spacer contiguous with the semiconductor structure and the sidewall of the alignment structure, with the sidewall spacer being of substantially the same height as the alignment structure, depositing an insulating layer contiguous with the sidewall spacer so as to insulate the semiconductor structure, with the insulating layer being of substantially the same height as the sidewall spacer, etching the sidewall spacer selectively to the sidewall of the alignment structure, the semiconductor structure and the insulating layer for forming a contact window opening for allowing access to the semiconductor structure, and backfilling the contact window opening with a conductive material so as to contact the semiconductor structure for forming the stud.

BRIEF DESCRIPTION OF THE DRAWINGS

These and other objects, features, aspects and advantages will be more readily apparent and better understood from the following detailed description of the invention, in which.

DETAILED DESCRIPTION OF THE PREFERRED EMBODIMENT

Although the following description refers to the structure and formation of studs for a gate conductor and a diffusion region, the invention contemplates forming studs to contact any structure or region as may be required for a semiconductor device. Furthermore, although the description refers to the use of an oxide cap, a gate conductor and a spacer as alignment structures used for aligning the studs thereto, it should be fully understood that the studs can be aligned to any structure existing on a wafer.

FIGS. 1A-1G illustrate the formation of a stud for a gate conductor, using the gate conductor and an oxide cap as alignment structures to which the stud is aligned. Advantageously, the contact region of the stud to the gate conductor is substantially along a sidewall of the gate conductor.

Figure 1A:
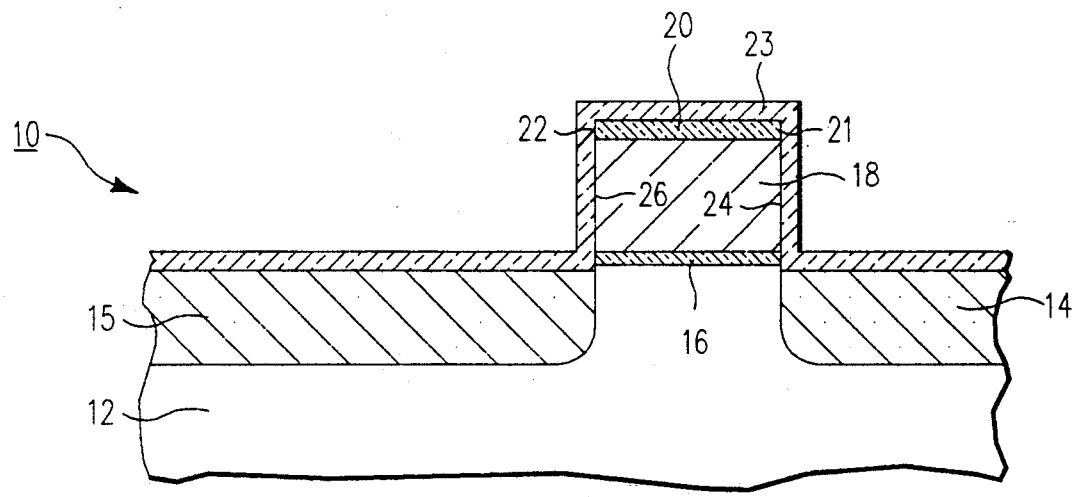
FIGS. 1A-1G are diagrammatic cross-sectional views showing a portion of a substrate during various stages of processing during formation of a stud for a gate conductor in accordance with the present invention.

Referring initially to FIG. 1A, there is shown a portion of a silicon wafer 10 having a substrate 12 with diffusion regions 14,15, a gate oxide 16, a gate electrode or conductor 18 having sidewalls 24,26 and being comprised of appropriate metal (such as polysilicon, titanium silicide, or the like), an oxide cap 20 having sidewalls 21,22, and a dielectric layer 23.

The diffusion regions 14,15, gate oxide 16, gate conductor 18 and oxide cap 20 are formed and patterned using conventional processes, such as deposition, diffusion, implantation, photolithography, and etching.

Figure 1B:
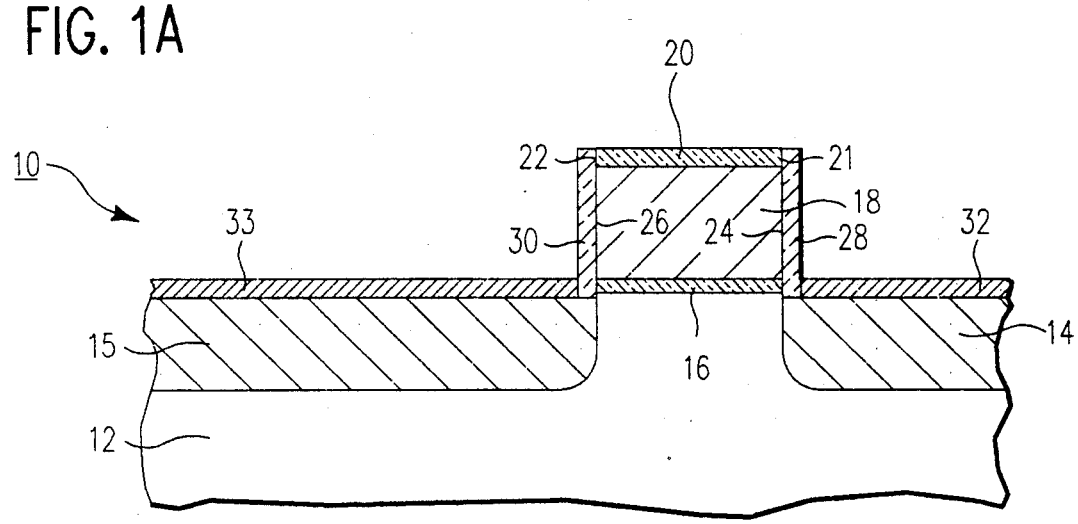

The dielectric layer 23 is deposited, such as by chemical vapor deposition, so as to coat the diffusion regions 14,15, the sidewalls 24,26 of the gate conductor 18, and the oxide cap 20. The dielectric layer 23 is then etched selectively to the diffusion regions 14,15 and the top of the oxide cap 20 such that only the dielectric which is contiguous with the sidewalls 21,22 of the oxide cap 20 and contiguous with the sidewalls 24,26 of the gate conductor 18 remain unetched. This remaining dielectric forms the sidewall spacers 28,30, as shown in FIG. 1B.

Note that the dimensions of the dielectric layer 23 determines the dimensions of the sidewall spacers 28,30, and the dimensions of the sidewall spacers 28,30 determine the dimensions of the stud being formed to contact the gate conductor 18. Therefore, the required dimensions of the stud must be taken into account at the time of deposition of the dielectric layer 23.

In this example, for reasons set forth hereinbelow, the dielectric layer 23 which forms the sidewall spacers 28,30 not only can be etched selectively to the diffusion regions 14,15 and the oxide cap 24, but the dielectric layer 23 and resulting sidewall spacers 28,30 can also be etched selectively to the gate conductor 18. Moreover, oxide can be polished selectively to the dielectric layer 23. Boron nitride (BN), silicon nitride, silicon boron nitride, and carbon boron nitride are examples of dielectrics having such selectivity.

Preferably, the dielectric layer 23 is deposited to a substantially uniform thickness, and the etching technique used to etch the dielectric layer 23 is directional or anisotropic. Illustratively, if a substantially uniform layer of BN is used as the dielectric layer 23 to form the sidewall spacers 28,30, a reactive ion etching (RIE) technique provides adequate anisotropy and etch selectivity to the diffusion regions 14,15 and to the oxide cap 20, using approximately the following parameters:

10% $CF_2$ in $O_2$ or 12% $CHF_3$ in $O_2$
80 mTORR of pressure
400 watts of power
20 Gauss of magnetic field Optionally, silicided junctions 32,33 are applied to the diffusion regions 14,15 to improve conductivity to these regions. The silicided junctions 32,33 are formed and patterned using known fabrication techniques. Although the silicided junctions 32,33 are shown as being applied to the diffusion regions 14,15 subsequent to deposition of the dielectric layer 23, it should be understood that the silicided junctions 32,33 can also be applied to the diffusion regions 14,15 prior to deposition of the dielectric layer 23.

Figure 1C:
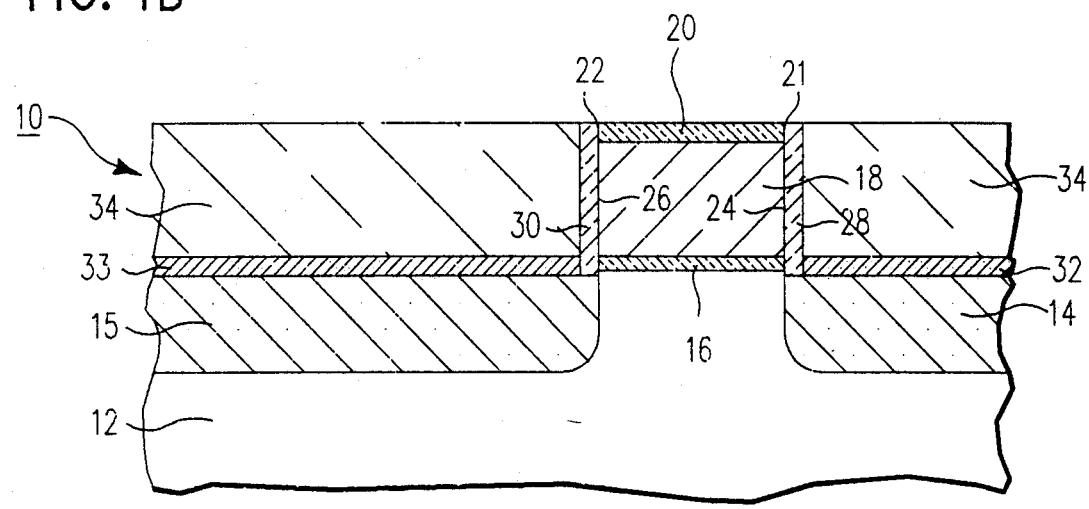

Next, as shown in FIG. 1C, an insulating layer 34, such as an oxide layer, is deposited, such as by chemical vapor deposition, so as to be contiguous with the sidewall spacers 28,30 and so as to cover and insulate the diffusion regions 14,15. The oxide layer 34 is then planarized or polished so that the top of the oxide layer 34 is substantially coplanar with the top of the sidewall spacers 28,30, i.e., the oxide layer 34 is polished until it is of substantially the same height as the sidewall spacers 28,30. It is to be understood that polishing is a method of planarizing materials during fabrication.

Since oxide polishes selectively to the dielectric used to form the sidewall spacers 28,30, i.e., the sidewall spacers 28,30 polish at a slower rate than oxide, the sidewall spacers 28,30 function as a "stop" during the polishing step. It should be realized that the use of oxide as the insulating layer 26 is for illustration purposes only and, as such, other dielectrics which polish at a faster rate than the dielectric used for the sidewall spacers 28,30 can be used in lieu of oxide. For example, a doped oxide such as phosphosilicate glass or borophosphosilicate glass can also be used.

Optionally, since the top of the oxide cap 20 is substantially coplanar with the top of the sidewall spacers 28,30, the top of the oxide cap 20 can be used as the polish stop in lieu of the sidewall spacers 28,30. In such an embodiment, a thin layer of material which is polish selective to oxide, such as silicon nitride, is deposited on top of the oxide cap 20. Such a layer can be deposited before formation of the gate conductor 18 and oxide cap 20, and must then be removed after the polishing step. However, it is preferable that the sidewall spacers 28,30 be used as the polish stop since an additional layer of material need not be added to serve as the polish stop and removed after the polishing step. In other words, use of the sidewall spacers 28,30 as the polish stop when polishing the oxide layer 34 is desirable over use of the oxide cap 20 because a reduction in the number of required steps is realized.

Figure 1D:
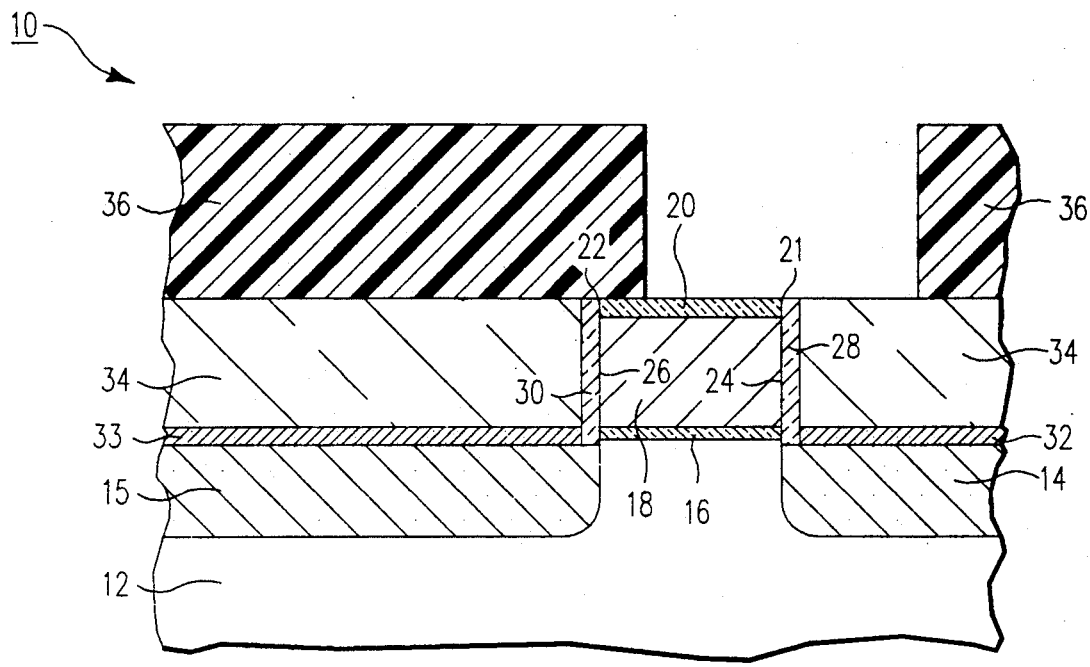

Next, a layer of photoresist is applied over the polished oxide layer 34. The photoresist layer is patterned using standard photolithographic techniques of exposure and development so as to form a photoresist blockout mask 36, as shown in FIG. 1D. The photoresist blockout mask 36 covers or blocks out sidewall spacer 30, but leaves sidewall spacer 28 exposed. As further described hereinafter, sidewall spacer 28 is exposed for etching for forming a gate conductor contact window. Although FIG. 1D shows sidewall spacer 28 exposed, the choice as to exposing sidewall spacer 28 or sidewall spacer 30 depends on the requirements of the semiconductor device being fabricated, as either sidewall spacer 28,30 can be etched to form a gate conductor contact window. However, it is important that the photoresist blockout mask 36 be patterned to cover the sidewall spacer which will not be used to form the gate conductor contact window, so that it will remain unetched.

Moreover, note that the photoresist blockout mask 36 does not cover the oxide cap 20 or the oxide layer 34 adjacent to the sidewall spacer 28 which is used to form the gate conductor contact window. Since the sidewall spacer 28 etches selectively to oxide, neither the oxide cap 20 nor the oxide layer 34 adjacent to the sidewall spacer 28 need to be covered by the photoresist blockout mask 36. Thus, the sidewall spacer 28 will be removed during etching and the oxide cap 20 and the oxide layer 34 will remain unetched. Accordingly, a high degree of accuracy is not required when forming the photoresist blockout mask 36 for etching the sidewall spacer 28.

The sidewall spacer 28 is then etched selectively to the oxide cap 20, the oxide layer 34 and the gate conductor 18. Again using BN as an example of the material used for the sidewall spacer 28, a RIE process using the parameters already set forth hereinabove will yield the required selectivity.

Figure 1E:
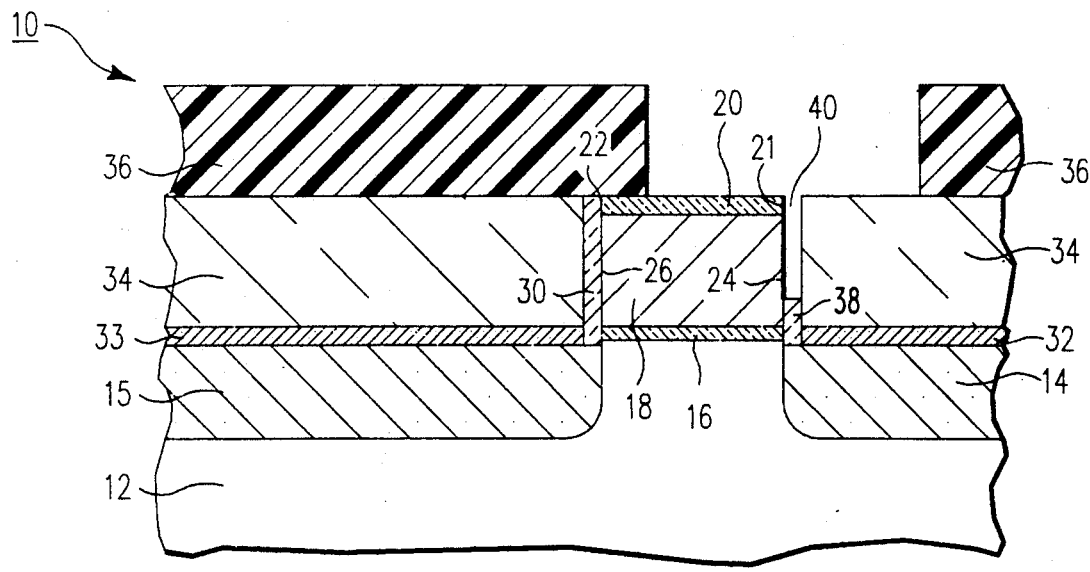

As shown in FIG. 1E, the sidewall spacer 28 is etched until a residual portion 38 of the sidewall spacer 28 remains, thus forming a gate conductor contact opening or window 40 which is a void having boundaries defined by the oxide layer 34, the sidewall 21 of the oxide cap 20, the sidewall 24 of the gate conductor 18, and the residual portion 38. As such, the etch selectivity properties of the sidewall spacer 28 allows formation of the gate conductor contact window 40 to be "self-aligned" to the sidewall 24 of the gate conductor 18 and to the sidewall 21 of the oxide cap 20. Further, the sidewall spacer 28 functions, at least in part, as a "sacrificial" structure in that the sidewall spacer 28 is etched and removed for forming the gate conductor contact window 40.

The residual portion 38 prevents the gate conductor 18 from shorting to the diffusion region 14 through the silicided junction 32 when the gate conductor contact window 40 is backfilled with stud material. Illustratively, the residual portion 38 measures approximately 750 Angstroms-1250 Angstroms in height, however, the residual portion 38 can be of any height that will prevent the gate conductor 18 from shorting to the diffusion region 14.

Figure 1F:
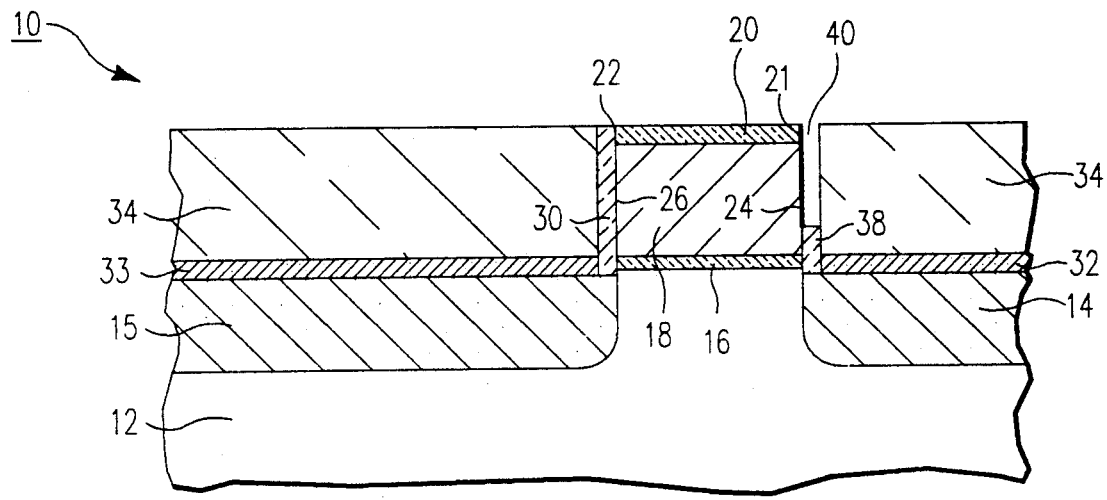

The photoresist blockout mask 36 is then stripped using standard techniques; and the wafer 10 is cleaned using, for example, a hydrofluoric acid cleaning process. The result is shown in FIG. 1F.

If required, before backfilling the gate conductor contact window 40 with stud material, a liner (not shown) can be deposited so as to line the gate conductor contact window 40. The liner reduces contact resistance between the stud and the gate conductor 18, and improves adhesion of the stud to the gate conductor 18 and oxide layer 34, thus solving any problems of delamination. By way of example, the liner can comprise titanium, titanium nitride, or other similar conductive material.

Figure 1G:
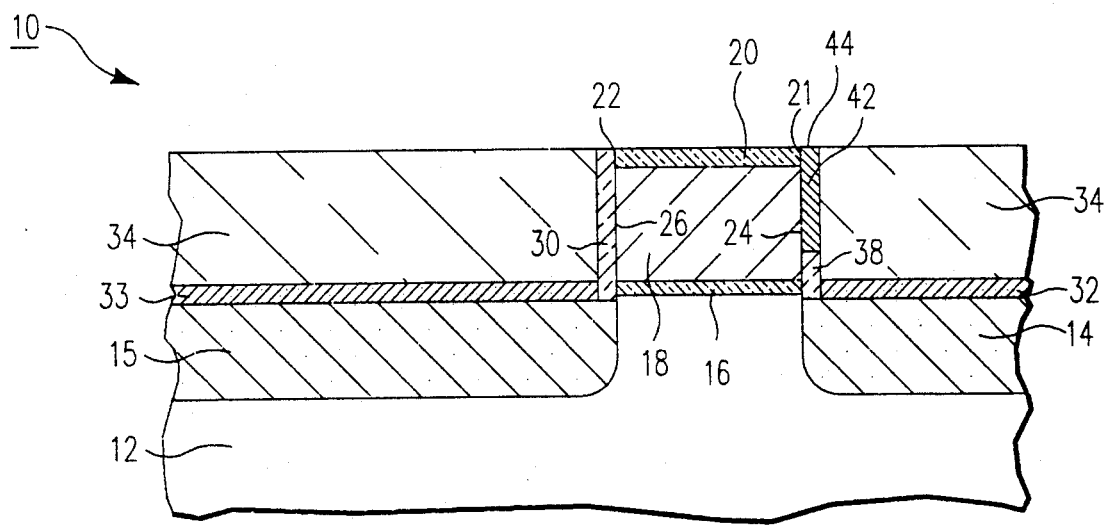

Next, the gate conductor contact window 40 is backfilled with appropriate stud material, for example titanium, titanium nitride, tungsten, or other appropriate metallurgy. As shown in FIG. 1G, the stud material is then polished to form the gate conductor contact stud 42 which includes an exposed surface 44 serving as an electrical contact point for connecting to other electrical devices. Thus, the boundaries of the gate conductor contact stud 42 are defined by the residual portion 38, the sidewall 24 of the gate conductor 18, the sidewall 21 of the oxide cap 20, and the oxide layer 34; and the gate conductor contact stud 42 is "self-aligned" to the oxide cap 20 and gate conductor 18.

Accordingly, the contact region of the gate conductor contact stud 42 to the gate conductor 18 is substantially along the entire sidewall 24 of the gate conductor 18, i.e., the contact region extends from the top of the residual portion 38 to the top of the gate conductor 18. Advantageously, contacting the gate conductor 18 along the sidewall 24 rather than on its top portion, increases the contact area between the gate conductor contact stud 42 and the gate conductor 18, thus minimizing contact resistance therebetween.

FIGS. 2A-2H illustrate the use of a spacer as an alignment structure for forming a stud for a diffusion region.

Figure 2A:
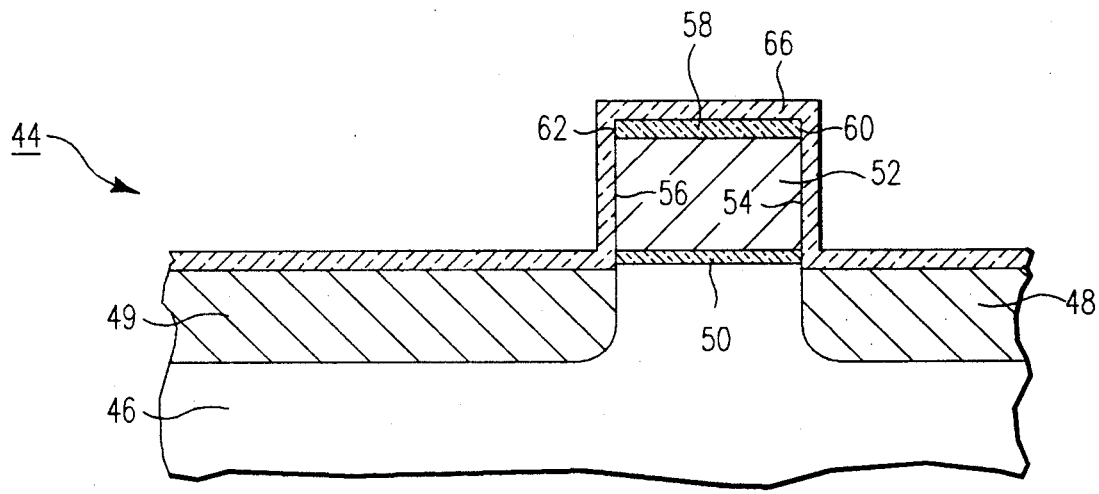
FIGS. 2A-2H are diagrammatic cross-sectional views showing a portion of a substrate during various stages of processing during formation of a stud for a diffusion region in accordance with the present invention.

Referring now to FIG. 2A, there is shown a portion of a silicon wafer 44 having a substrate 46 with diffusion regions 48,49, a gate oxide 50, a gate conductor 52 having sidewalls 54,56 and being comprised of appropriate metal (such as polysilicon, titanium silicide, or the like), an oxide cap 58 having sidewalls 60,62, and a first layer 66 which is comprised of a dielectric material.

Figure 2B:
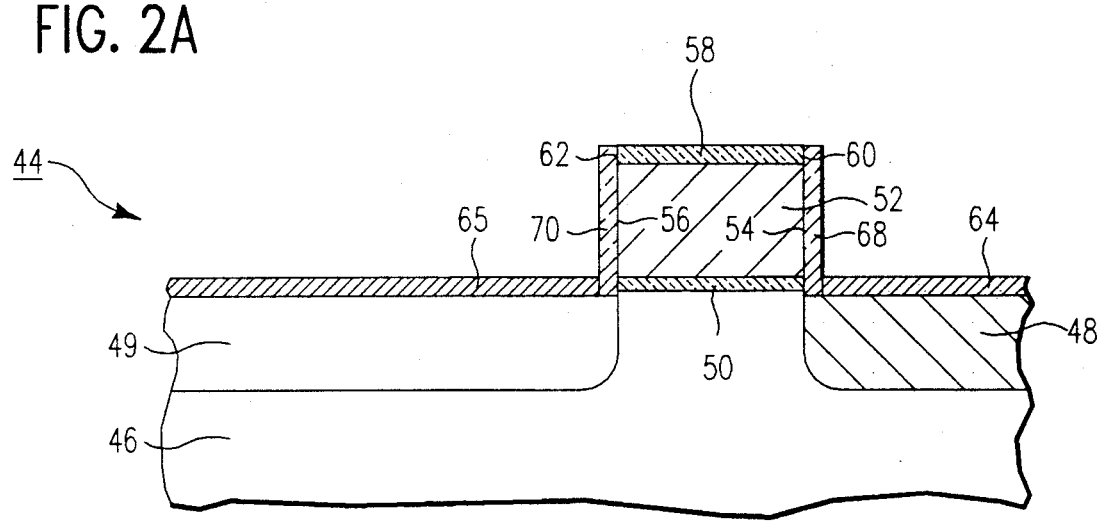

The diffusion regions 48,49, gate oxide 50, gate conductor 52 and oxide cap 58 are formed and patterned using conventional processes of diffusion, deposition and photolithography. The first layer 66 is then deposited so as to coat the diffusion regions 48,49, the sidewalls 54,56 of the gate conductor 52, and the oxide cap 58. The first layer 66 is then etched selectively to the diffusion regions 48,49 and the top of the oxide cap 58 such that only the material which is contiguous with the sidewalls 60,62 of the oxide cap 58 and contiguous with the sidewalls 54,56 of the gate conductor 58 remain unetched. This remaining material forms the first set of spacers 68,70, as shown in FIG. 2B. Thus, it is important that the dielectric material used to form the first layer 66 has etch selectivity to diffusion regions and oxide. For example, using nitride with a conventional directional etching technique, such as a RIE technique, will yield the desired selectivity.

Optionally, the silicided junctions 64,65 are then applied to the diffusion regions 48,49 to improve conductivity of these regions. The silicided junctions 64,65 are formed and patterned using known fabrication techniques.

Figure 2C:
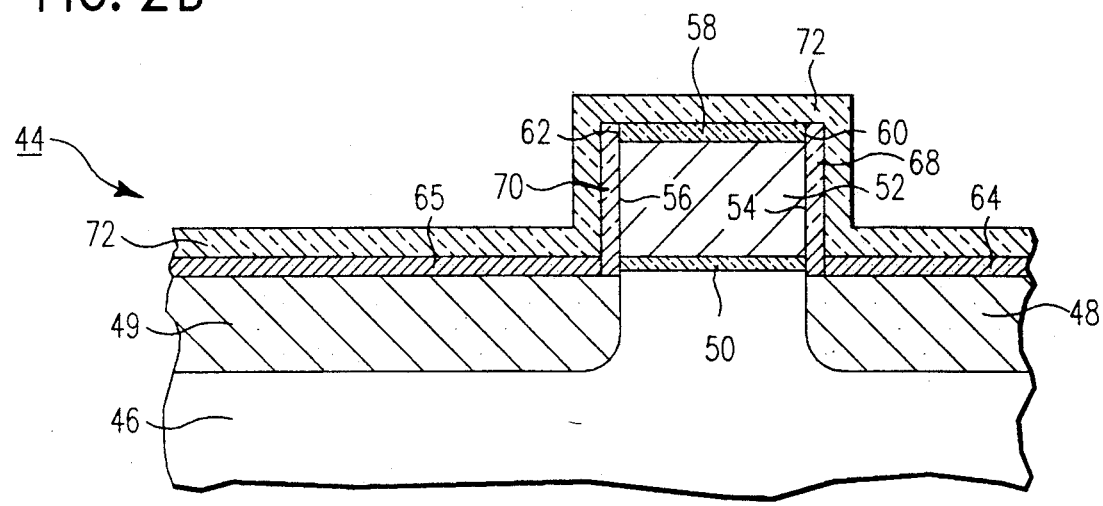
Figure 2D:
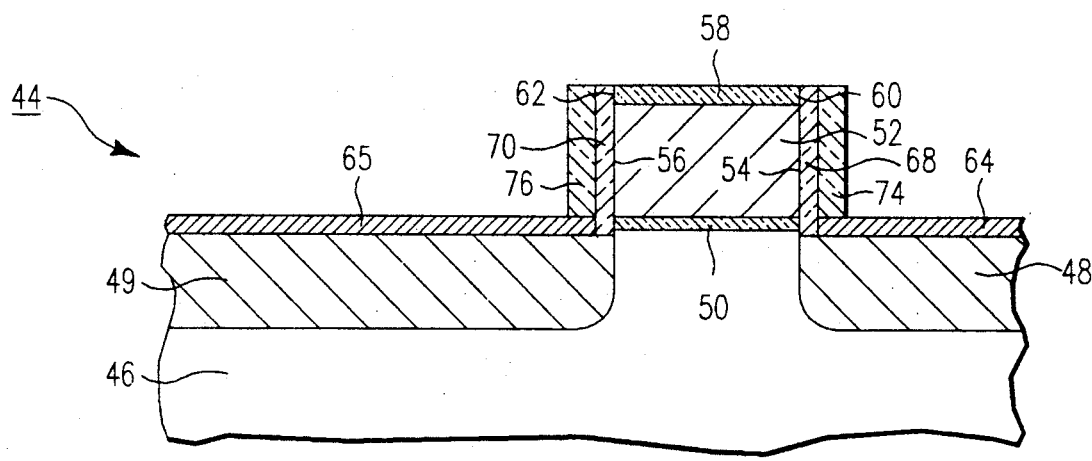

Next, as shown in FIG. 2C, a second layer 72 is deposited, such as by chemical vapor deposition, so as to coat the silicided junctions 64,65, the first set of spacers 68,70, and the top of the oxide cap 58. The second layer 72 is then etched selectively to the silicided junctions 64,65, the top of the oxide cap 58 and the first set of spacers 68,70 such that only the material which is contiguous with the first set of spacers 68,70 remains unetched. Thus, the remaining material forms a second set of spacers 74,76 which are of substantially the same height as the first set of spacers 68,70, as shown in FIG. 2D.

It should be realized that the dimensions of the second layer 72 determines the dimensions of the second set of spacers 74,76, and the dimensions of the second set of spacers 74,76 determine the dimensions of the stud being formed to contact the diffusion region 48. Therefore, the required dimensions of the stud must be taken into account at the time of deposition of the second layer 72.

In this example, for reasons set forth hereinbelow, the second layer 72 which forms the second set of spacers 74,76 not only can be etched selectively to the silicided junctions 64,65, the oxide cap 58 and the first set of spacers 68,70, but oxide can also be polished selectively to the second layer 72 and resulting second set of spacers 74,76. In this regard, it can be realized that selection of the material used to form the second layer 72 depends in part on the dielectric material used to form the first set of spacers 68,70. For instance, if the first set of spacers 68,70 comprise nitride, then boron nitride, silicon boron nitride, carbon boron nitride, and silicon nitride have the required etch and polish selectivities to be used to form the second set of spacers 74,76.

Preferably, the second layer 72 is deposited in a uniform thickness, and the etching technique used to etch the second layer 72 is directional or anisotropic. Illustratively, if a substantially uniform layer of BN is used as the second layer 72 to form the second set of spacers 74,76, then a reactive ion etching (RIE) technique using the parameters set forth hereinabove provides the required anisotropy and etch selectivity.

Figure 2E:
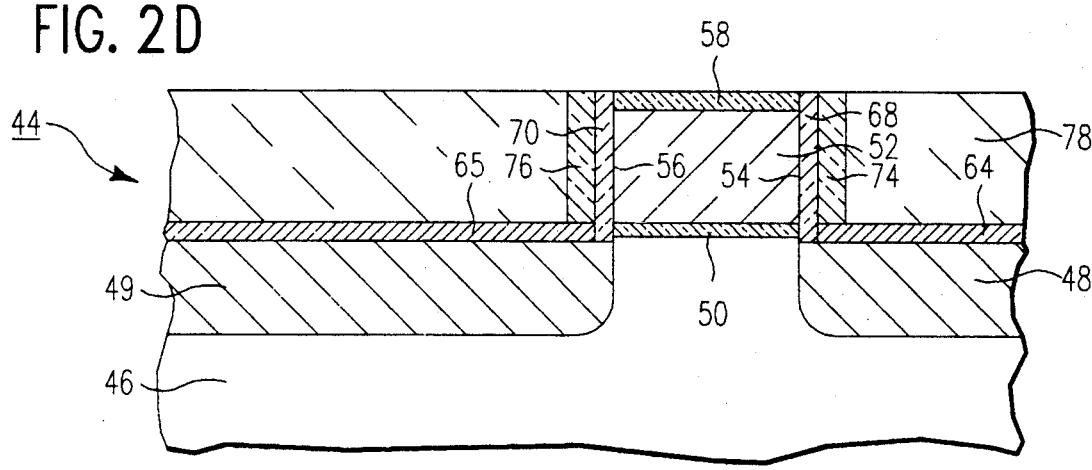

Reference is now made to FIG. 2E. An insulating layer 78, such as an oxide layer, is deposited, such as by chemical vapor deposition, so as to be contiguous with the second set of spacers 74,76 and so as to cover and insulate the silicided junctions 64,65 and diffusion regions 48,49. The oxide layer 78 is then polished so that the top of the oxide layer 78 is substantially coplanar with the top of the first set of spacers 68,70 and second set of spacers 74,76, i.e., the oxide layer 78 is polished until it is of substantially the same height as the second spacers 74,76. Since oxide polishes selectively to the dielectric material used to form the second set of spacers 74,76, i.e., the second set of spacers 74,76 polish at a slower rate than oxide, the second set of spacers 74,76 function as a "stop" during the polishing step. It should be realized that the use of oxide as the insulating layer 78 is for illustration purposes only and, as such, other dielectrics which polish at a faster rate than the dielectric used for the second set of spacers 74,76 can be used in lieu of oxide. For example, a doped oxide such as phosphosilicate glass or borophosphosilicate glass can also be used.

Optionally, since the top of the oxide cap 58 and the top of the first set of spacers 68,70 are substantially coplanar with the top of the second set of spacers 74,76, the top of such structures can also be used as the polish stop in lieu of the second set of spacers 74,76. A thin layer of material which is polish selective to oxide, such as silicon nitride, may be required to be deposited on top of the oxide cap 58 and/or first set of spacers 68,70 for such structures to function as the polish stop. The thin layer would then have to be removed subsequent to the polishing step.

Figure 2F:
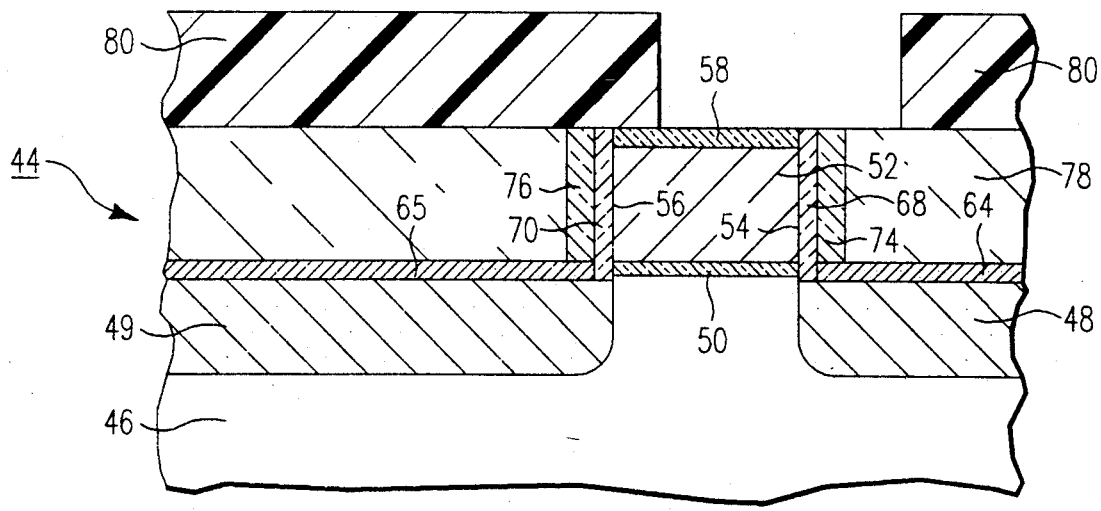

In accordance with the next step of the invention, a layer of photoresist is applied over the polished oxide layer 78. The photoresist layer is patterned using standard photolithographic techniques of exposure and development so as to form a photoresist blockout mask 80, as shown in FIG. 2F. The photoresist blockout mask 80 covers or blocks out spacer 70 and spacer 76, but leaves spacer 68 and spacer 74 exposed. As further described hereinafter, spacer 74 is exposed for etching for forming a diffusion contact window. Although FIG. 2F shows spacer 74 exposed, the choice as to exposing spacer 74 or spacer 76 depends on the requirements of the semiconductor device being fabricated, as either spacer 74 or spacer 76 can be etched to form a diffusion contact window. However, it is important that the photoresist blockout mask 80 be patterned to cover the spacer which will not be used to form the diffusion contact window, so that it will remain unetched.

Moreover, note that the photoresist blockout mask 80 does not cover the oxide cap 58 or the oxide layer 78 adjacent to the spacer 74 being used to form the diffusion contact window. Since the spacer 74 etches selectively to oxide, neither the oxide cap 58 nor the oxide layer 78 adjacent to the spacer 74 need to be covered by the photoresist blockout mask 80. Thus, the spacer 74 will be removed during etching and the oxide cap 58 and the oxide layer 78 will remain unetched. Accordingly, a high degree of accuracy is not required when forming the photoresist blockout mask 80 for etching the spacer 74. In this regard, since spacer 74 also etches selectively to spacer 70, if desired, spacer 70 also need not be covered by the photoresist blockout mask 80.

The spacer 74 is then etched selectively to the oxide cap 58, the oxide layer 78 and spacer 68. Again using BN as an example of the material used to form the spacer 74, a RIE process using the parameters already set forth hereinabove will yield the required selectivity.

Figure 2G:
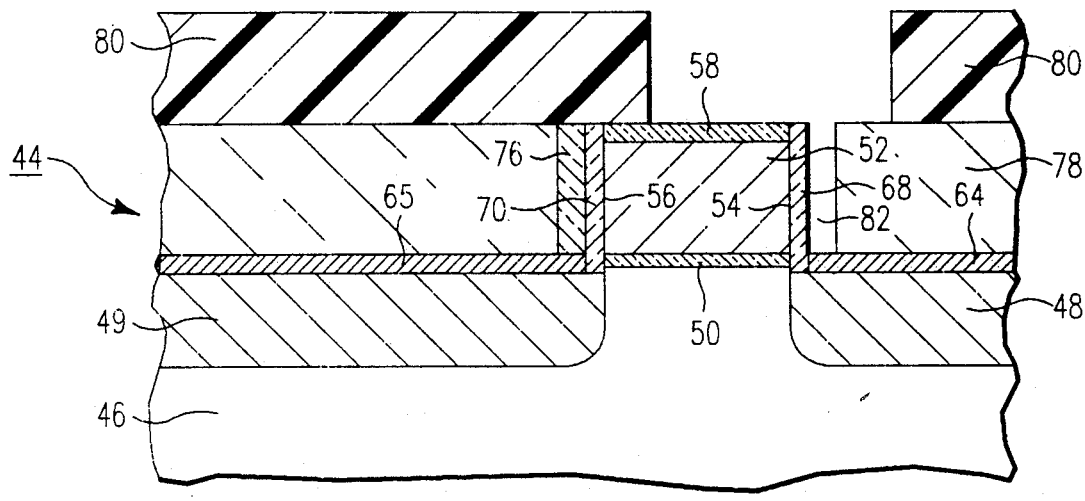

As shown in FIG. 2G, the spacer 74 is etched and removed, thus forming diffusion contact opening or window 82 which is a void having boundaries defined by oxide layer 78, spacer 68 and silicided junction 64. As such, the etch selective properties of the spacer 74 allows formation of the diffusion contact window 82 to be "self-aligned" to the spacer 68. Further, the spacer 74 functions as a "sacrificial" structure in that the spacer 74 is etched and removed for forming the diffusion contact window 82.

The spacer 68 prevents the gate conductor 52 from shorting to the diffusion region 48 through the silicided junction 64 when the diffusion contact window 82 is backfilled with stud material.

Figure 2H:
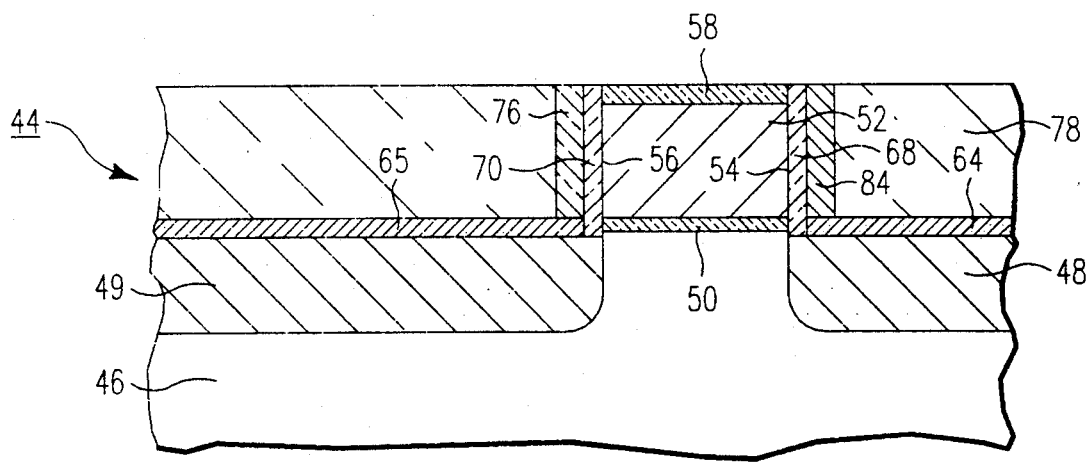

The photoresist blockout mask 80 is then stripped using standard techniques; and the wafer 44 is cleaned using, for example, a hydrofluoric acid cleaning process. The result is shown in FIG. 2H.

Next, the diffusion contact window 82 is backfilled with appropriate stud material, for example titanium, titanium nitride, tungsten, or other appropriate metallurgy. The stud material is then polished to form the diffusion contact stud 84, as shown in FIG. 2H. It can be seen that the spacer 68 separates and insulates the gate conductor 52 so as to prevent the gate conductor 52 from shorting with the diffusion region 48 via the diffusion contact stud 84 and silicided junction 64.

Thus, the boundaries of the diffusion contact stud 84 are defined by the spacer 68, the oxide layer 34 and the silicided junction 64; and the diffusion contact stud 42 is "self-aligned" to the spacer 68.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A semiconductor device, comprising:
   a substrate;
   a diffusion region formed in said substrate;
   a gate conductor formed above said substrate adjacent to said diffusion region, said gate conductor having a sidewall;
   an insulating cap formed above and in contact with said gate conductor;
   a residual insulating portion formed above and in contact with said diffusion region, and aligned with and contacting said sidewall of said gate conductor, said residual insulating portion having a width; and
   an electrically conducting stud formed above and in contact with said residual insulating portion such that said residual insulating portion prevents electrical contact between said electrically conducting stud and said diffusion region, said electrically conducting stud being aligned with and electrically contacting said sidewall of said gate conductor, and said stud having an exposed top surface which provides an electrical contact point for allowing electrical connection to said gate conductor, said exposed top surface being coplanar with said insulating cap.

2. A semiconductor device according to claim 1, wherein said residual insulating portion and said electrically conducting stud each have a width which is substantially less than the width of said gate conductor.

3. A semiconductor device according to claim 1 or 2, wherein said electrically conducting stud and said residual insulating portion are of substantially the same width.

4. A semiconductor device according to claim 1, wherein said gate conductor has a low aspect ratio.

5. A semiconductor device according to claim 4, wherein said electrically conducting stud contacts a substantial portion of the sidewall of said gate conductor for maximizing contact area between said electrically conducting stud and said gate conductor.

6. A semiconductor device according to claim 1, further comprising insulating means for insulating said gate conductor and said electrically conducting stud, whereby the exposed top surface of said electrically conducting stud is not insulated by said insulating means.

7. A semiconductor device according to claim 6, wherein said electrically conducting stud has boundaries defined by said gate conductor, said residual insulating portion, and said insulating means.

* * * * *